US009123401B2

(12) United States Patent
Tran et al.

(10) Patent No.: US 9,123,401 B2
(45) Date of Patent: Sep. 1, 2015

(54) NON-VOLATILE MEMORY ARRAY AND METHOD OF USING SAME FOR FRACTIONAL WORD PROGRAMMING

(71) Applicant: Silicon Storage Technology, Inc., San Jose, CA (US)

(72) Inventors: Hieu Van Tran, San Jose, CA (US); Anh Ly, San Jose, CA (US); Thuan Vu, San Jose, CA (US); Hung Quoc Nguyen, Fremont, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 270 days.

(21) Appl. No.: 13/652,447

(22) Filed: Oct. 15, 2012

(65) Prior Publication Data
US 2014/0104965 A1    Apr. 17, 2014

(51) Int. Cl.
*G11C 5/14* (2006.01)
*G11C 11/56* (2006.01)
*G11C 16/08* (2006.01)
*G11C 16/10* (2006.01)
*G11C 8/08* (2006.01)

(52) U.S. Cl.
CPC *G11C 5/145* (2013.01); *G11C 8/08* (2013.01); *G11C 11/5628* (2013.01); *G11C 16/08* (2013.01); *G11C 16/10* (2013.01)

(58) Field of Classification Search
CPC .......... G11C 5/145; G11C 16/10; G11C 8/08; G11C 11/5628; G11C 16/08
USPC ............................ 365/185.05, 185.11, 185.18
See application file for complete search history.

(56) References Cited

U.S. PATENT DOCUMENTS

| 5,930,183 | A  | * | 7/1999  | Kojima et al. ............... 365/200 |
|-----------|----|---|---------|--------------------------------------|
| 6,058,044 | A  | * | 5/2000  | Sugiura et al. ........... 365/185.17 |
| 6,134,145 | A  | * | 10/2000 | Wong ........................ 365/185.22 |
| 7,868,375 | B2 |   | 1/2011  | Liu et al. |
| 2002/0126550 | A1 | * | 9/2002 | Sugio ............................ 365/200 |
| 2006/0120165 | A1 |   | 6/2006 | Hemink |
| 2006/0291305 | A1 | * | 12/2006 | Suzuki et al. ................ 365/200 |
| 2009/0161437 | A1 | * | 6/2009 | Pyeon et al. ............. 365/185.17 |
| 2009/0196103 | A1 |   | 8/2009 | Kim |
| 2010/0082917 | A1 | * | 4/2010 | Yang et al. ................... 711/157 |
| 2010/0146186 | A1 | * | 6/2010 | Traister et al. ............... 711/103 |
| 2011/0044102 | A1 |   | 2/2011 | Dong et al. |
| 2012/0020161 | A1 | * | 1/2012 | Haukness ................ 365/185.17 |

OTHER PUBLICATIONS

PCT Search Report and Written Opinion dated Dec. 13, 2013 corresponding to the related PCT Patent Application No. US2013/064013.

* cited by examiner

*Primary Examiner* — J. H. Hur
(74) *Attorney, Agent, or Firm* — DLA Piper LLP (US)

(57) ABSTRACT

A non-volatile memory device that includes N planes of non-volatile memory cells (where N is an integer greater than 1). Each plane of non-volatile memory cells includes a plurality of memory cells configured in rows and columns. Each of the N planes includes gate lines that extend across the rows of the memory cells therein but do not extend to others of the N planes of non-volatile memory cells. A controller is configured to divide each of a plurality of words of data into N fractional-words, and program each of the N fractional-words of each word of data into a different one of the N planes of non-volatile memory cells. The controller uses a programming current and a program time period for the programming, and can be configured to vary the programming current by a factor and inversely vary the program time period by the factor.

20 Claims, 15 Drawing Sheets

PLANEA:

| | WL-sel | WL-unsel | BL-sel | BL-unsel | CG-sel | CG-unsel | EG-sel | EG-unsel | SL-sel | SL-unsel |
|---|---|---|---|---|---|---|---|---|---|---|
| Read | 1.0-2V | 0V | 0.6-2V | 0V | 0-2.6V | 0-2.6V | 0-2.6V | 0-2.6V | 0V | 0V |
| Erase | 0V | 0V | 0V | 0V | 0 – (-8) V | 0-2.6V | 8-12V | 0-2.6V | 0V | 0V |
| Program | 1V | 0V | 1uA | Vinh | 8-11V | 0-2.6V | 4.5-8V | 0-2.6V | 4.5-5V | 0V/SLBIAS |

PLANEB:

| | WL-sel | WL-unsel | BL-sel | BL-unsel | CG-sel | CG-unsel | EG-sel | EG-unsel | SL-sel | SL-unsel |
|---|---|---|---|---|---|---|---|---|---|---|
| Read | 1.0-2V | 0V | 0.6-2V | 0V | 0-2.6V | 0-2.6V | 0-2.6V | 0-2.6V | 0V | 0V |
| Erase | 0V | 0V | 0V | 0V | 0 – (-8) V | 0-2.6V | 8-12V | 0-2.6V | 0V | 0V |
| Program | 1V | 0V | Vinh | Vinh | 0V | 0-2.6V | 0V | 0-2.6V | Vinh | 0V/SLBIAS |

FIG. 7

PLANEA:

| | WL-sel | WL-unsel | BL-sel | BL-unsel | CG-sel | CG-unsel | EG-sel | EG-unsel | SL-sel | SL-unsel |
|---|---|---|---|---|---|---|---|---|---|---|
| Read | 1.0-2V | 0V | 0.6-2V | 0V | 0-2.6V | 0-2.6V | 0-2.6V | 0-2.6V | 0V | 0V |
| Erase | 0V | 0V | 0V | 0V | 0 – (-8) V | 0-2.6V | 8-12V | 0-2.6V | 0V | 0V |
| Program | 1V | 0V | 1uA | Vinh | 8-11V | 0-2.6V | 4.5-8V | 0-2.6V | 4.5-5V | 0V /SLBIAS |

PLANEB:

| | WL-sel | WL-unsel | BL-sel | BL-unsel | CG-sel | CG-unsel | EG-sel | EG-unsel | SL-sel | SL-unsel |
|---|---|---|---|---|---|---|---|---|---|---|
| Read | 1.0-2V | 0V | 0.6-2V | 0V | 0-2.6V | 0-2.6V | 0-2.6V | 0-2.6V | 0V | 0V |
| Erase | 0V | 0V | 0V | 0V | 0 – (-8) V | 0-2.6V | 8-12V | 0-2.6V | 0V | 0V |
| Program | 1V | 0V | 0V | 0V | 0V | 0-2.6V | 0V | 0-2.6V | 0V | 0V /SLBIAS |

FIG. 8

NON-VOLATILE MEMORY ARRAY AND METHOD OF USING SAME FOR FRACTIONAL WORD PROGRAMMING

FIELD OF THE INVENTION

The present invention relates to a non-volatile memory cell device and a method of operating same. More particularly, the present invention relates to such memory device in which the memory array is segmented so that only a fraction of a word is written to the array at any given time.

BACKGROUND OF THE INVENTION

Non-volatile memory cells are well known in the art. One prior art non-volatile memory cell 10 is shown in FIG. 1. The memory cell 10 comprises a semiconductor substrate 12 of a first conductivity type, such as P type. The substrate 12 has a surface on which there is formed a first region 14 (also known as the source line SL) of a second conductivity type, such as N type. A second region 16 (also known as the drain line) also of N type is formed on the surface of the substrate 12. Between the first region 14 and the second region 16 is a channel region 18. A bit line (BL) 20 is connected to the second region 16. A word line (WL) 22 (also referred to as the select gate or row line) is positioned above a first portion of the channel region 18 and is insulated therefrom. The word line 22 has little or no overlap with the second region 16. A floating gate (FG) 24 is over another portion of the channel region 18. The floating gate 24 is insulated therefrom, and is adjacent to the word line 22. The floating gate 24 is also adjacent to the first region 14. A coupling gate (CG) 26 (also known as control gate) is over the floating gate 24 and is insulated therefrom. An erase gate (EG) 28 is over the first region 14 and is adjacent to the floating gate 24 and the coupling gate 26 and is insulated therefrom. The erase gate 28 is also insulated from the first region 14. The cell 10 is more particularly described in U.S. Pat. No. 7,868,375 whose disclosure is incorporated herein by reference in its entirety.

One exemplary operation for erase and program is as following. The cell 10 is erased, through a Fowler-Nordheim tunneling mechanism, by applying a high voltage on the erase gate 28 with the other terminals equal to zero volts. Electrons tunnels from the floating gate 24 into the erase gate 28 causing the floating gate 24 to be positively charged, turning on the cell 10 in a read operation, the resulting memory cell erased state is known as '1' state. The cell 10 is programmed, through source side hot electron programming mechanism, by applying a high voltage on the coupling gate 26, a high voltage on the source line 14, a medium voltage on the erase gate 28, and a programming current on the bit line 20. A portion of electrons flowing across the gap between the word line 22 and the floating gate 24 acquire enough energy to inject into the floating gate 24 causing the floating gate 24 to be negatively charged, turning off the cell 10 in a read operation, the resulting memory cell programmed state is known as '0' state. The cell 10 in the same row is inhibited in the programming by applying an inhibit voltage on its bit line 20.

The conventional array architecture is illustrated in FIG. 2. The array includes non-volatile memory cells 10 of the type shown in FIG. 1, arranged in a plurality of rows and columns in the semiconductor substrate 12. Adjacent to the array of non-volatile memory cells are address decoders (e.g. XDEC 40, YMUX 42, HVDEC 44) and a bit line controller (BLIN-HCTL 46) used to decode addresses and supply the various voltages to the source 14, drain and bit line 16/20, WL 22, FG 24, CG 26 and EG 28 during read, program, and erase operations for selected memory cells.

Erase and program operations require a relatively high voltage, which is supplied by a charge pump CHRGPMP 48. Typically, an entire word of data (e.g. 37 bits that include 32 bits of data and 5 bits of ECC) is written during a single program operation into a single row of memory cells. Therefore, a typical configuration for the array is that there are 4096 columns of memory cells, which provides enough memory cells in each row to store an entire word of data. FIG. 3 illustrates the electrical configuration of the various rows and columns. In the example shown, the array is broken down into sectors, with each sector including 8 rows (i.e. rows 0-7). In operation, a row with its selected memory cells is programmed in one programming operation. To accomplish this, the word lines (WL), the coupling gate lines CG and the erase gate lines EG extend all the way across each row, and electrically connect to each memory cell in the row. This means that during a program operation, the charge pump 48 must be capable of supplying the high voltages to the entire row of selected memory cells. The same is true for erase operations. One consequence is that such a charge pump having the capability of supplying the high voltage across the entire row of selected memory cells is relatively large in size and thus consumes a significant amount of space on the chip. Another consequence is the amount of power consumed by the charge pump.

There is a need for a memory cell design and operation thereof that would allow the reduction of the charge pump size and power consumption.

BRIEF SUMMARY OF THE INVENTION

The aforementioned issues are solved by a non-volatile memory device that includes N planes of non-volatile memory cells (where N is an integer greater than 1). Each plane of non-volatile memory cells includes a plurality of memory cells configured in rows and columns. Each of the N planes includes gate lines that extend across the rows of the memory cells therein but do not extend to others of the N planes of non-volatile memory cells. A controller is configured to divide each of a plurality of words of data into N fractional-words, and program each of the N fractional-words of each word of data into a different one of the N planes of non-volatile memory cells.

In another aspect of the present invention is a method of operating a non-volatile memory device. The memory device includes N planes of non-volatile memory cells (where N is an integer greater than 1). Each plane of non-volatile memory cells includes a plurality of memory cells configured in rows and columns. Each of the N planes includes gate lines that extend across the rows of the memory cells therein but do not extend to others of the N planes of non-volatile memory cells. The method includes dividing each of a plurality of words of data into N fractional-words, and programming each of the N fractional-words of each word of data into a different one of the N planes of non-volatile memory cells.

Another aspect of the present invention is a non-volatile memory device that includes N planes of non-volatile memory cells, where N is an integer greater than or equal to 1. Each plane of non-volatile memory cells includes a plurality of memory cells configured in rows and columns. Each of the N planes includes gate lines that extend across the rows of the memory cells therein. A controller is configured to divide each of a plurality of words of data into N fractional-words, program each of the N fractional-words of each word of data into one of the N planes of non-volatile memory cells using a programming current and within a program time period, vary the programming current by a factor, and inversely vary the program time period by the factor.

In another aspect of the present invention, a non-volatile memory device includes first and second memory arrays. Each of the memory arrays includes N planes of non-volatile memory cells, where N is an integer greater than 1. Each plane of non-volatile memory cells includes a plurality of memory cells configured in rows and columns. Each of the N planes includes gate lines that extend across the rows of the memory cells therein but do not extend to others of the N planes of non-volatile memory cells. A controller is configured to divide each of a plurality of words of data into N fractional-words, and program each of the N fractional-words of each word of data into a different one of the N planes of non-volatile memory cells. A first row decoder and a first column decoder are for decoding addresses for the memory cells of the first memory array. A second row decoder and a second column decoder are for decoding addresses for the memory cells of the second memory array. A source line decoder is disposed between the first and second memory arrays for decoding addresses for the memory cells of both the first and second memory arrays.

Other objects and features of the present invention will become apparent by a review of the specification, claims and appended figures.

BRIEF DESCRIPTION OF THE DRAWINGS

FIG. 7 is a table showing the voltages used to program memory cells in PlaneA according to a first technique of the present invention.

FIG. 8 is a table showing the voltages used to program memory cells in PlaneA according to a second technique of the present invention.

DETAILED DESCRIPTION OF THE INVENTION

The present invention is a non-volatile memory device and a method of operating same in which fractions of words are programmed within any given programming operation, such that smaller components such as charge pumps can be utilized.

Figure 1:
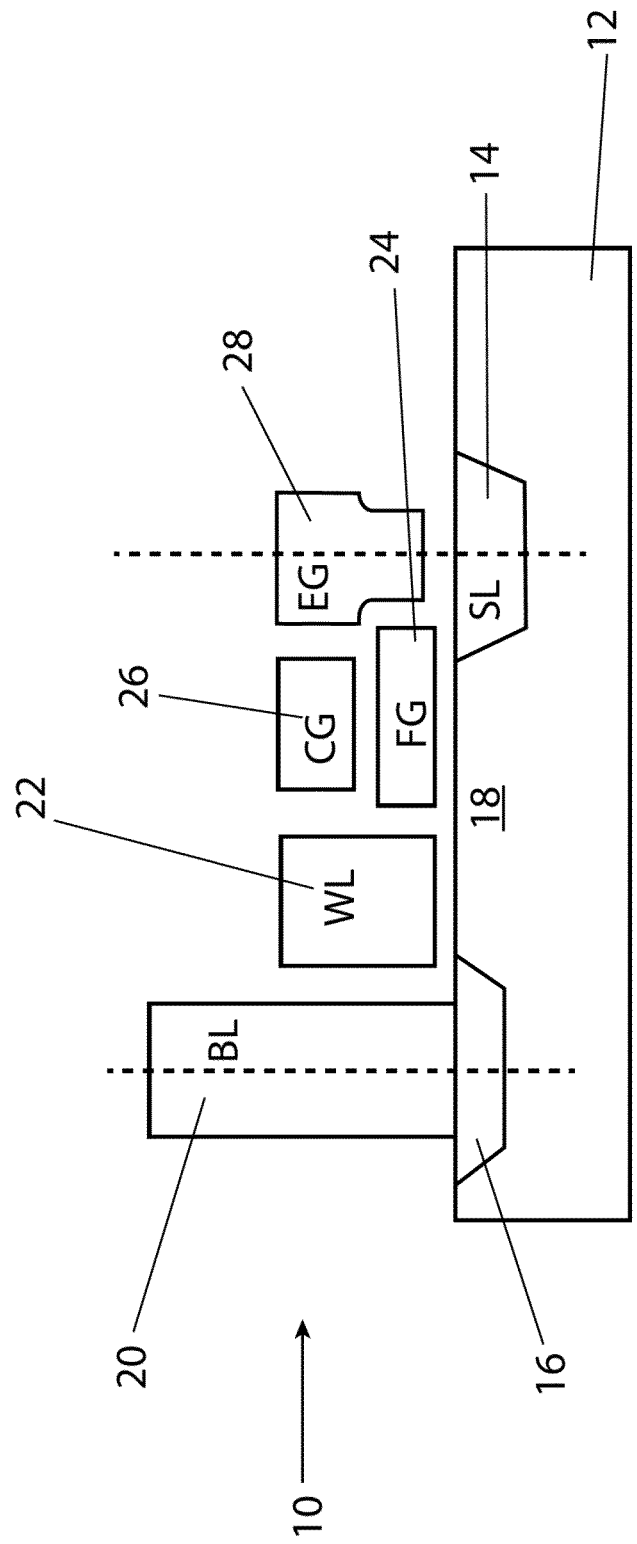
FIG. 1 is a cross-sectional view of a conventional non-volatile memory cell to which the configuration and method of the present invention can be applied.
Figure 2:
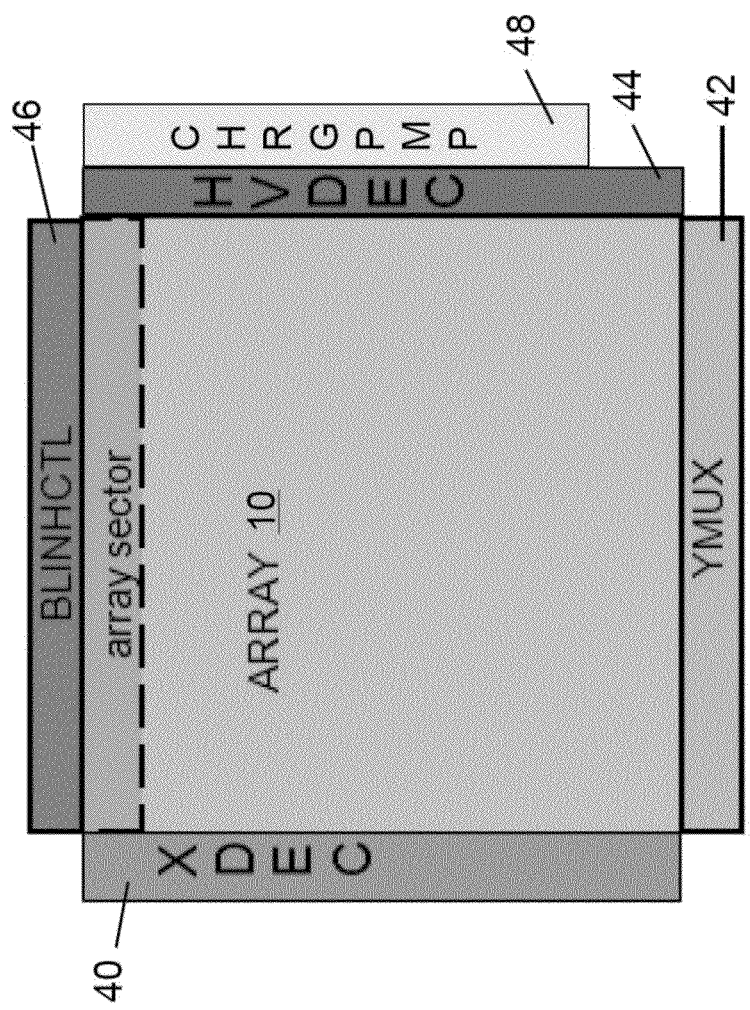
FIG. 2 is a block diagram of a conventional non-volatile memory device.
Figure 3:
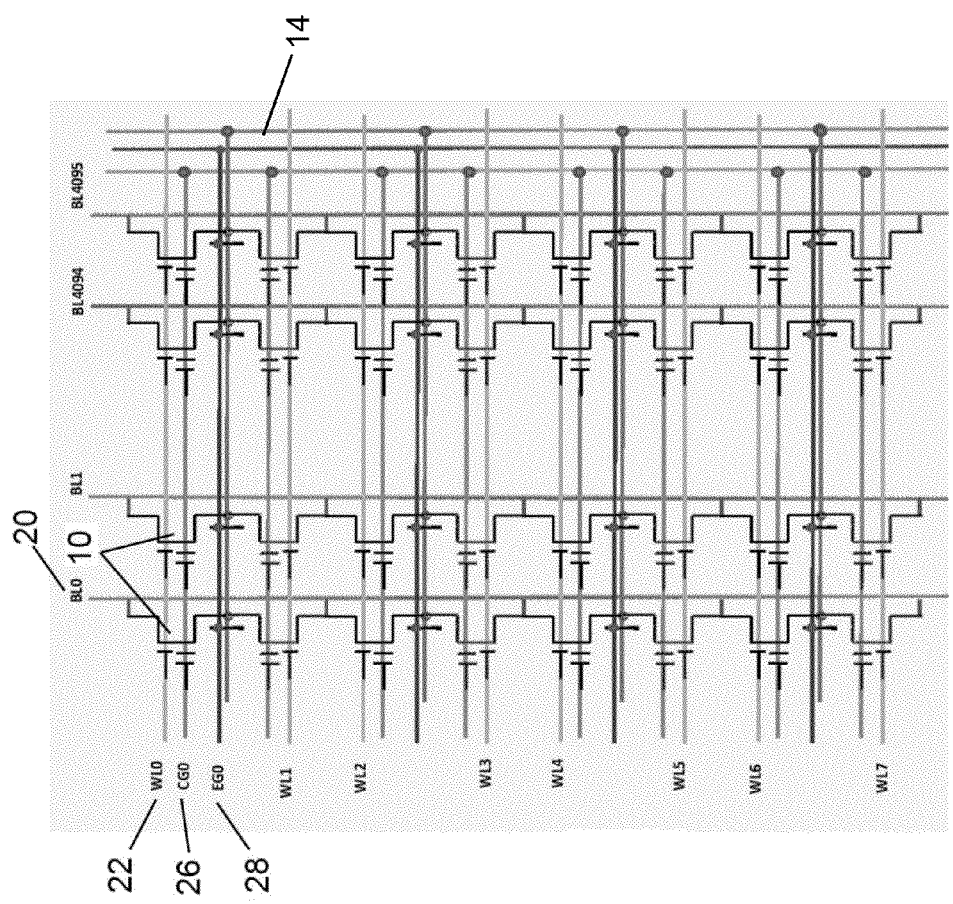
FIG. 3 is a schematic diagram of an array architecture of a conventional non-volatile memory device.
Figure 4:
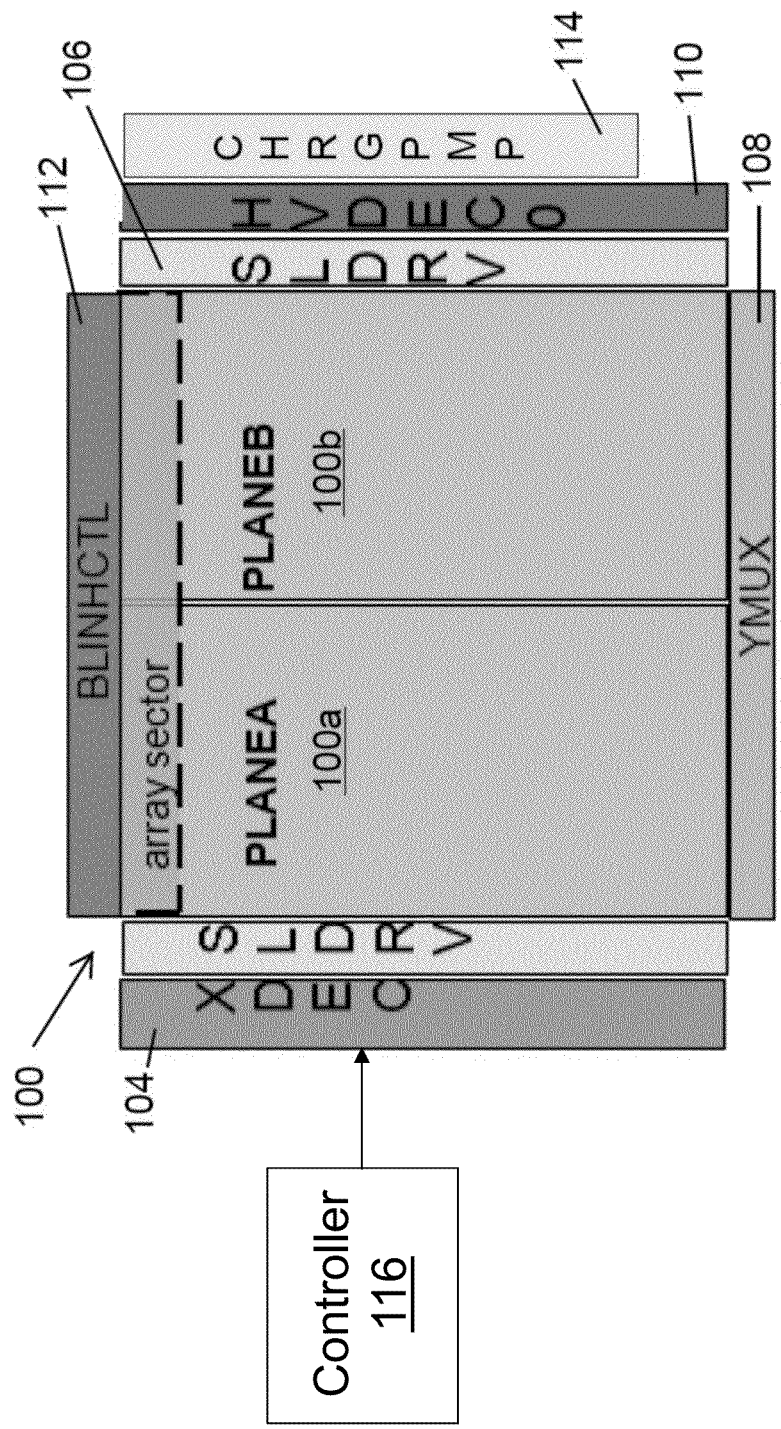
FIG. 4 is a block diagram of the non-volatile memory device of the present invention.

The architecture of the memory array of the present invention is illustrated in FIG. 4. The memory array 100 includes two separate planes (PlaneA 102a and PlaneB 102b) of non-volatile memory cells 10 of the type shown in FIG. 1 formed on a single chip, arranged in a plurality of rows and columns in the semiconductor substrate 12. PlaneA 102a includes the first 2048 columns of memory cells, and PlaneB 102b includes the second 2048 columns of memory cells. Adjacent to the array of non-volatile memory cells are address decoders (e.g. XDEC 104 (row decoder), SLDRV 106, YMUX 108 (column decoder), HVDEC 110) and a bit line controller (BLINHCTL 112) used to decode addresses and supply the various voltages to the source 14, drain and bit line 16/20, WL 22, FG 24, CG 26 and EG 28 during read, program, and erase operations for selected memory cells. Charge pump CHRGPMP 114 supplies the high voltage for program and erase operations.

Figure 5:
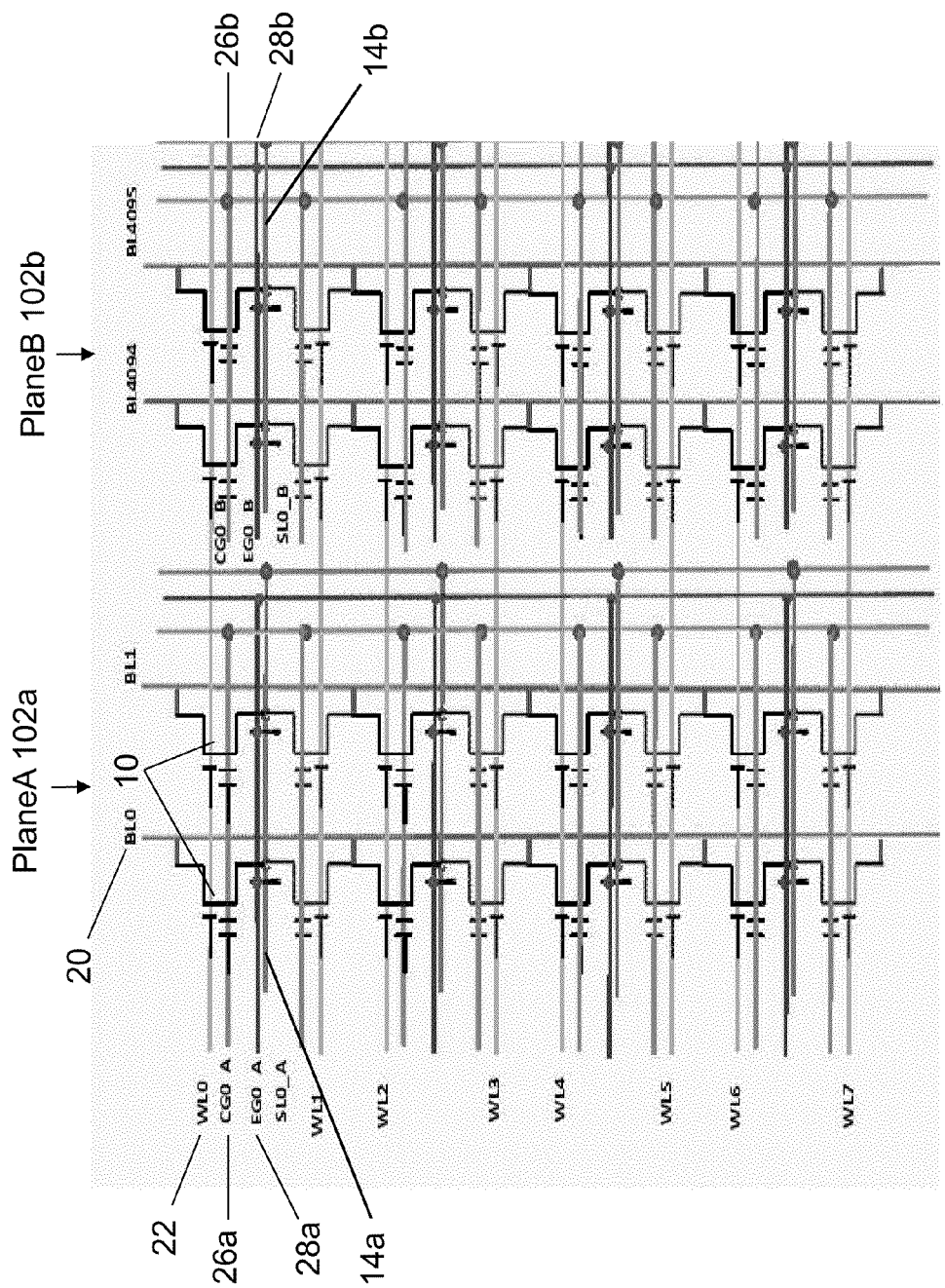
FIG. 5 is a schematic diagram of an array architecture of the non-volatile memory device of the present invention.

FIG. 5 illustrates the electrical configuration of planes 102a and 102b of the memory array 100. The array is broken down into sectors, with each sector including 8 rows of one of the planes 102a or 102b. In operation, the memory device programs half of each word of data during a programming operation, into half of a row (i.e. into PlaneA 102a or PlaneB 102b). To accomplish this, the word lines (WL) 22 can extend all the way across the entire rows. However, the coupling gate lines CG 26, the source lines SL 14 and the erase gate lines EG 28, which are the lines that selectively handle high voltages during program and erase operations, extend only half way across any given row (i.e. only extend across the row of PlaneA 102a or PlaneB 102b, so that there are two separate coupling gate lines CG 26a and 26b, two source lines SL 14a and 14b, and two separate erase gate lines EG 28a and 28b for any given row). This means that during a program operation, the charge pump 114 need only supply the high voltages to half a row of memory cells over these lines. The same is true for erase operations. Therefore, a much smaller sized charge pump 114 can be utilized, saving significant space on the chip. Another advantage is that the amount of power consumed by the charge pump is less than if the charge pump were delivering high voltages across the entire row as opposed to only half a row. Still yet another advantage is that the programming time for each sector for each plane A/B is same as in a one single plane configuration. This architecture maintains the same program disturb time as in the single plane case (disturb time is time to disturb the unselected cells in the same selected sector) while maintaining low area overhead (because of the sharing of the same word line and the sharing of the high voltage decoders) and high performance (separate source line decoder for each plane).

The only downside of this configuration is that it will take longer to program an entire word of data (which involves two programming operations each programming half the word of data into half of a row of memory cells), compared to if an entire word of data were programmed into a row of memory cells using a single program operation. However, this downside can be alleviated by implementing a method referred to herein as the "<N'0'bit-programming method." This method operates as follows. Data in='0' indicates the cell is to be in the programmed state='0' after the operation. Data in='1' indicates the cell is to be in the erased state '1' after the operation. For each word of for example 37 bits (e.g., consists of 19-bit halfword and another 18-bit halfword), count N number of data in bit '0' to be programmed. If N is less than or equal to 19, then program the whole 37-bit-word (two halfwords) at the same programming pulse. This is possible since the charge pump can provide the voltage and current needed to program to a maximum of 19 bits (can program either a 19-bit halfword or a 18-bit halfword). For example, if the data to be programmed is checkerboard pattern, inverse checkerboard pattern, or majority '1' bit pattern (number of '1' is more than number of '0' bit), the full word (two halfwords) can be programmed in one programming operation (consume one programming operation time period). This technique can be expanded to cover multiple fractional words across multiple memory array planes.

Figure 6:
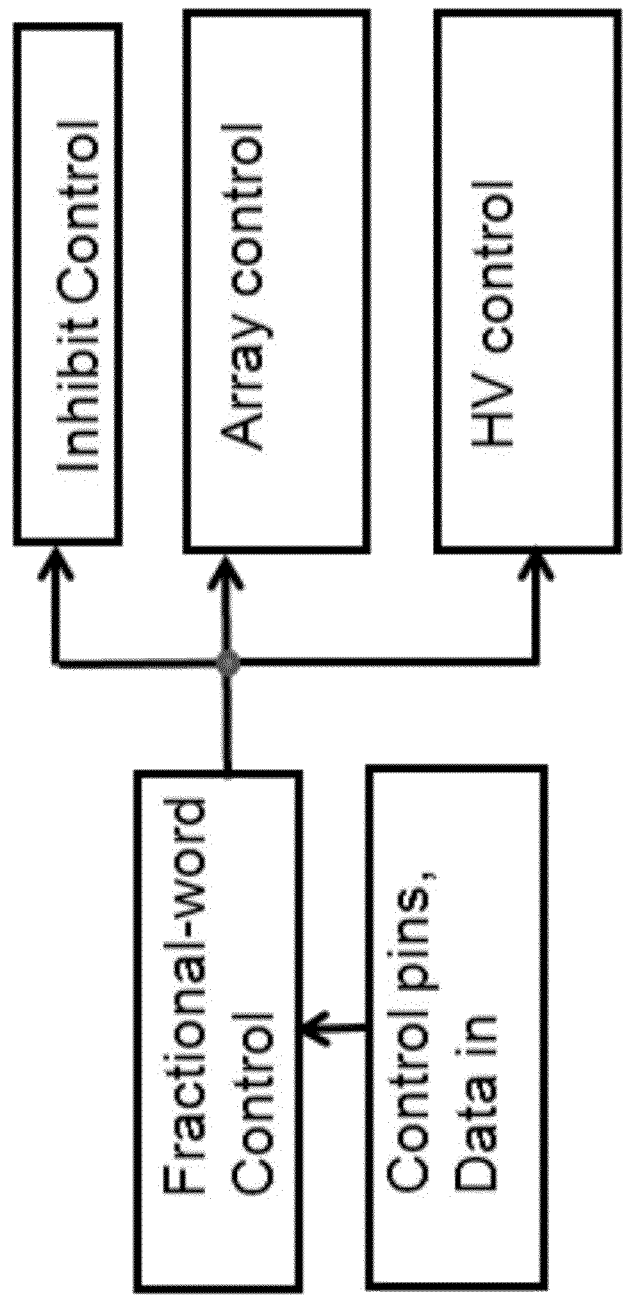
FIG. 6 is a control block diagram of the non-volatile memory device of the present invention.

FIG. 6 illustrates the control logic of the controller 116 of memory array 100 for implementing the above described programming and erase operations. As the data arrives, fractional word control is implemented to divide each word of data into two halfwords of data, with each halfword written to one of the planes of memory (PlaneA 102a or PlaneB 102b). High voltage control (using charge pump 114), array control and inhibit control are implemented to write the halfwords to the memory array 100 as described above. A Method of fractional word detection can include the following. For example, for a word of 37 bits (Datain [0:36]) consisting of a 19-bit halfword (Datain [0:18]) and a 18-bit halfword (data in [19:36]), Datain [0:36] is monitored by the controller 116. If Datain [0:18]=all '1' data, then 18-bit halfword (Datain[19:36]) is enabled for programming, since data in ='1' does not need to be programmed. If Datain [19:36]=all '1' data, then 19-bit halfword (Datain[0:18]) is enabled for programming. If both Datain [0:18] and Datain [19:36]='1' then no programming operation is performed.

FIG. 7 illustrates non-limiting exemplary voltages used to program a halfword to PlaneA 102a according to a first programming technique. The table of FIG. 7 includes voltages for both selected and unselected wordline WL, bit line BL, control gate CG, erase gate EG and select line SL. According to this programming technique, all the halfwords representing the first halves of the words of data are programmed to PlaneA 102a first, and then all halfwords representing the second halves of the words of data are programmed to PlaneB 102b. This programming technique has the advantage of lower power due to the fact that there is no switching back and forth between memory planes after each halfword. The controller 116 keeps track of all halfwords for each plane of memory. The voltage inhibit circuits for producing Vinh can be the same for both planes of memory.

FIG. 8 illustrates non-limiting exemplary voltages used to program a halfword to
PlaneA 102a according to a second programming technique. The table of FIG. 8 includes voltages for both selected and unselected wordline WL, bit line BL, control gate CG, erase gate EG and select line SL. According to this programming technique, the first halfword of the first word of data is programmed to PlaneA 102a, then the second halfword of the first word of data is programmed to PlaneB 102b, then same is done for the first and second halfwords of the second word of data, and so on until all the words of data are programmed into the memory array 100. The voltage inhibit circuits for producing Vinh are different for the planes of memory.

While the above description and referenced figures disclose a memory array configured with two planes of memory, memory array 100 can be configured to include more than two planes of memory. With embodiments where memory array 100 includes three or more planes of memory, each word can be divided into a plurality of fractional words that match in number to the number of memory planes. Specifically, where memory array 100 includes N planes of memory, where N is an integer greater than 1, each word of data is divided into N fractional-words.

In the case where memory array 100 has N planes of memory and utilizes the first programming technique described above (i.e. a plane-by-plane programming technique), programming is implemented by programming the first fractional-word of the first word of data into the first plane of memory, then programming the first fractional-word of the second word of data into the first plane of memory, and so on until the first fractional-word of the last word of data is programmed into the first plane of memory. Then, the process is repeated for the second fractional-words into the second plane of memory, and so on until the Nth fractional-words are programmed into the Nth plane of memory.

In the case where memory array 100 has N planes of memory and utilizes the second programming technique described above (i.e. a word-by-word programming technique), programming is implemented by programming the first fractional-word of the first word of data into the first plane of memory, then programming the second fractional-word of the first word of data into the second plane of memory, and so on until the Nth fractional-word of the first word of data is programmed into the Nth plane of memory. Then, the process is repeated for the second word of data, and so on until all the words of data are programmed.

An adaptive I-T (current-time) fractional word programming method to enhance the program performance can be implemented as follows. Programming current Iprog and programming time Tprog is traded off to maximize the programming time (faster programming time and less disturb time). Iprog increases by a factor K and Tprog decreases by a factor K to keep programming efficiency the same (memory cell can be programmed to proper programmed state since Iprog*Tprog is a constant). K equals the number of bits in a half word divided by the number of bits to be programmed. For example, for a 16-bit half word data='00FF', only 8 bits '0' needs to be programmed with this adaptive I-T (current-time) fractional word programming method. Assume that the charge pump can program all bits in a half word in one program operation. In this operation, Iprog increases by a factor of 2 (factor K=16/8) and Tprog decreases by a factor of 2. Hence the programming time is twice as fast and disturb time is reduced by half. Reversely, Iprog may decrease by a factor K and Tprog may increase by a factor K to keep the programming efficiency the same. In this embodiment, the number of bits to programmed now may be increased by the same factor K. This method reduces the pre and post programming time period such as for sequentially timed enabling and clean up timing per the programming operation. This effectively increases the program data rate (i.e. same number of bits programmed in a certain amount of time without increasing pre and post programming time).

Figure 9:
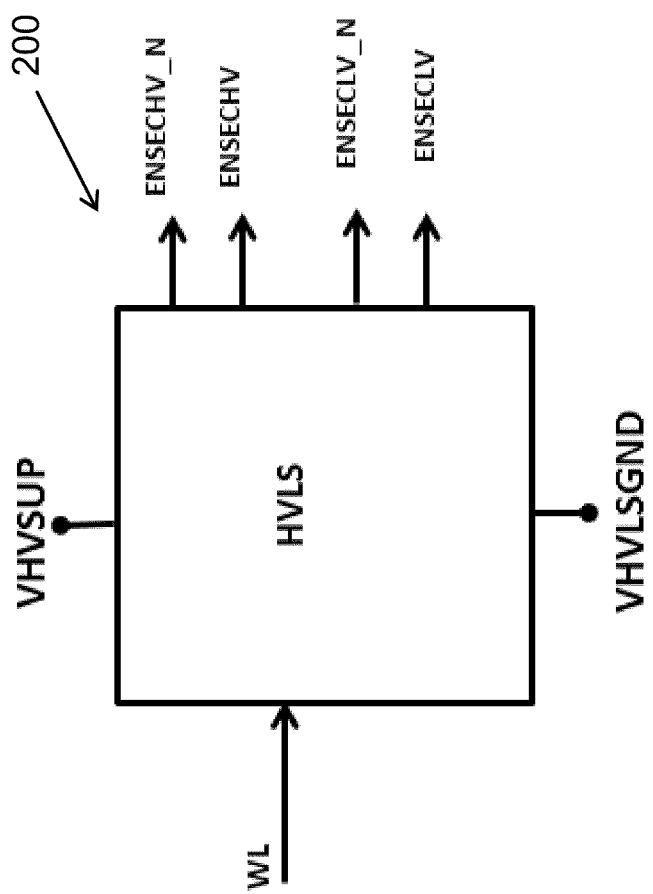
FIG. 9 is a diagram of a portion of a high voltage decoder that supplies voltages for programming, erasing, and reading the memory cells of the present invention.

FIG. 9 illustrates a high voltage decoder 200 to be used in circuit 110 of FIG. 4. The circuit 200 is used for decoding an array sector (per 8 rows) and is shared between the planes A/B in FIG. 4.

Figure 10:
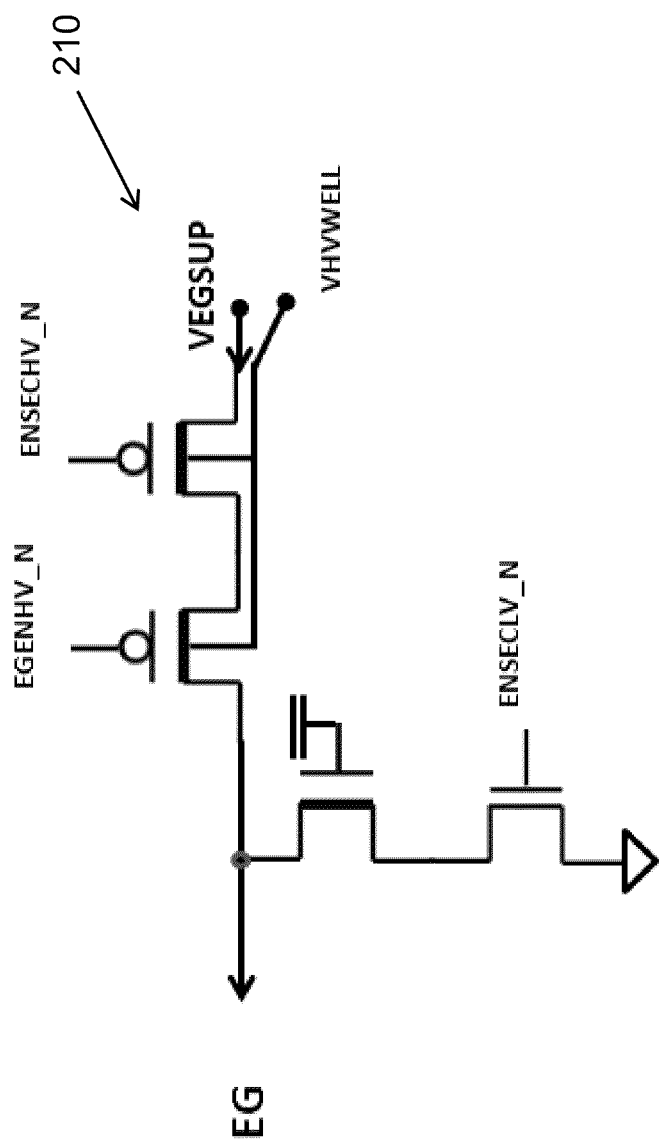
FIG. 10 is a circuit diagram of a portion of a high voltage decoder that supplies voltages for programming, erasing, and reading the memory cells of the present invention.

FIG. 10 illustrates a high voltage EG decoder 210 to be used in circuit 110 of FIG. 4. Decoder 210 provides the voltage for terminals EG 28a/28b for the two planes A/B in FIG. 5. The decoding lines from circuit 110 for the terminal EG 28a of plane A run across plane B. Since the EG line carries no current, there is no voltage drop, and hence no affect on performance while maintaining low area overhead (circuit next to sector decoder, on the edge of the array). It should be noted that the erase gate EG requires higher voltage for operation hence there is cascoding circuit configuration. The cascoding circuit configuration means having two MOS transistors in series. The two PMOS transistor in series is also for purpose of decoding and current limiting.

Figure 11:
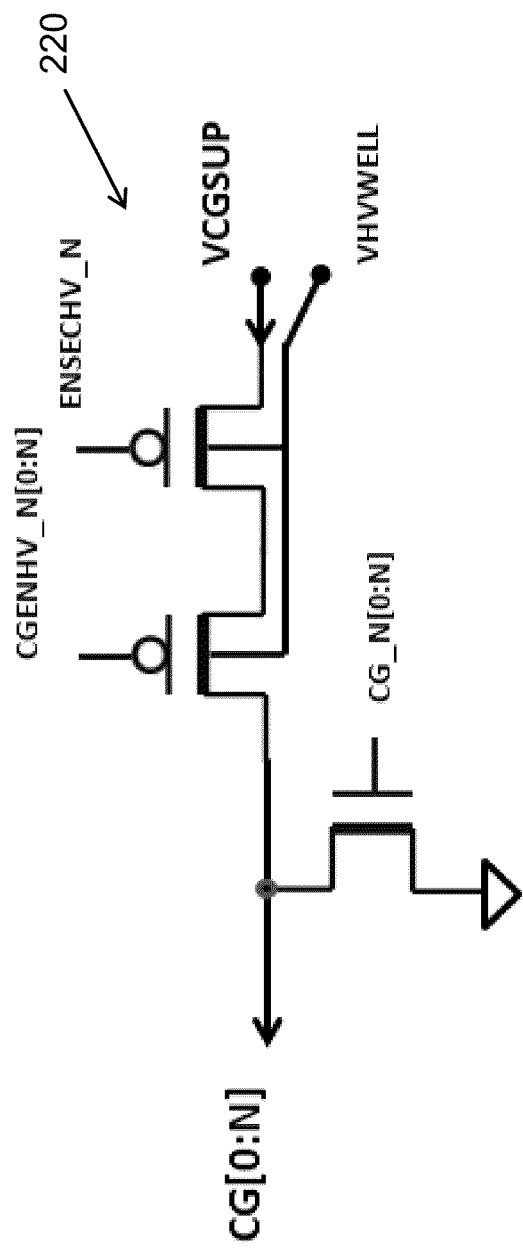
FIG. 11 is a circuit diagram of a portion of a high voltage decoder that supplies voltages for programming, erasing, and reading memory cells of the present invention.

FIG. 11 illustrates a high voltage CG decoder 220 to be used in circuit 106 of FIG. 4. Decoder 220 is used provide voltage for terminal CG 26a/26b in FIG. 5. The decoding lines from circuit 110 for the terminal CG 26a of plane A run across plane B. Since the CG line carries no current, there is no voltage drop, hence no affect on performance while maintaining low area overhead (circuit next to sector decoder, on the edge of the array). It should be noted that control gate CG requires less high voltage, and hence there is no need for a cascoding circuit configuration. The two PMOS transistors in series are for purpose of decoding and current limiting.

Figure 12:
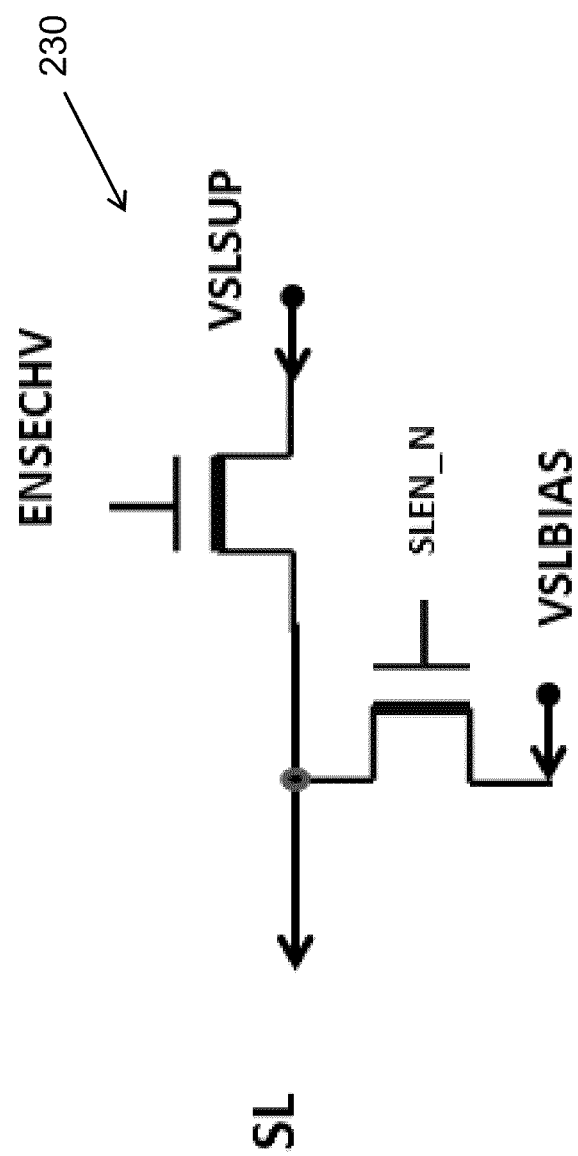
FIG. 12 is a circuit diagram of a portion of a high voltage decoder that supplies voltages for programming, erasing, and reading memory cells of the present invention.

FIG. 12 illustrates a high voltage SL decoder 230 to be used on the left and right of the two planes in circuit 106 of FIG. 4. Decoder 230 is used to provide voltage for terminal SL 14a/14b in FIG. 5. The position of the SL decoder 230 is on left edge and right edge of the two planes A/B in FIG. 4, to minimize area overhead (less overhead compared to placing the circuit 106 in the middle) and optimize performance (less I-R voltage drop since the driver in circuit 230 is next to SL terminals in memory array planes A/B). It should be noted that the source line SL requires less high voltage, and hence there is no need for a cascoding circuit configuration.

Figure 13:
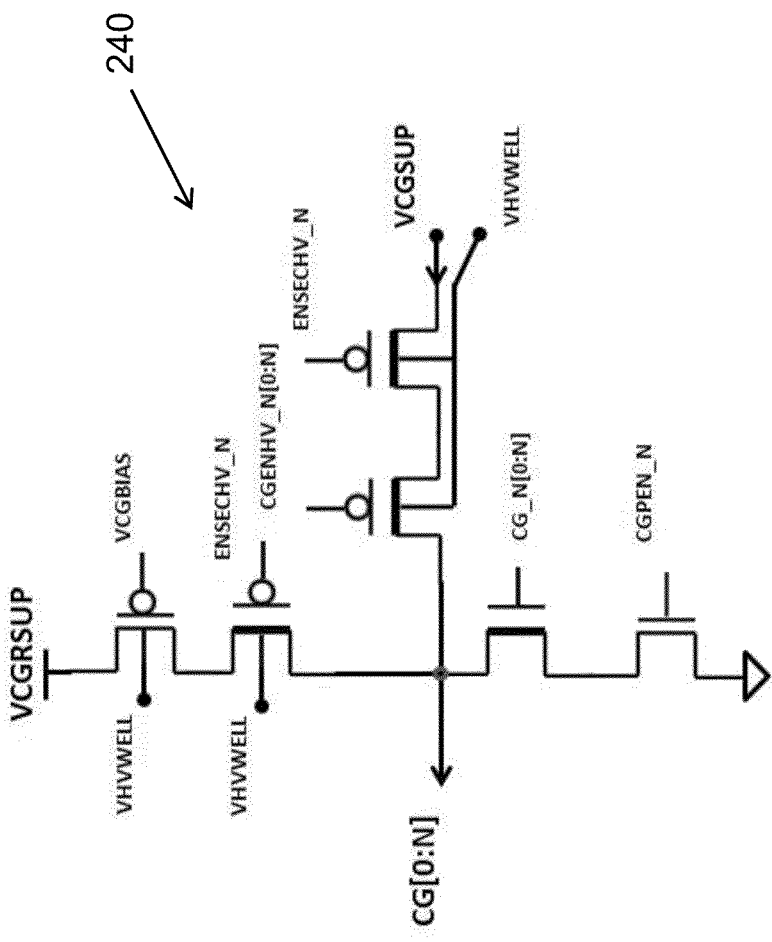
FIG. 13 is a circuit diagram of a portion of a high voltage decoder that supplies voltages for programming, erasing, and reading memory cells of the present invention.

FIG. 13 illustrates an alternative high voltage CG decoder 240 to be used in circuit 110 of FIG. 4. This circuit can supply one more supply level voltages than that of the circuit 11 to optimize the operating condition such as standby and read, and select vs. unselect conditions (as shown in FIGS. 7 and 8).

Figure 14:
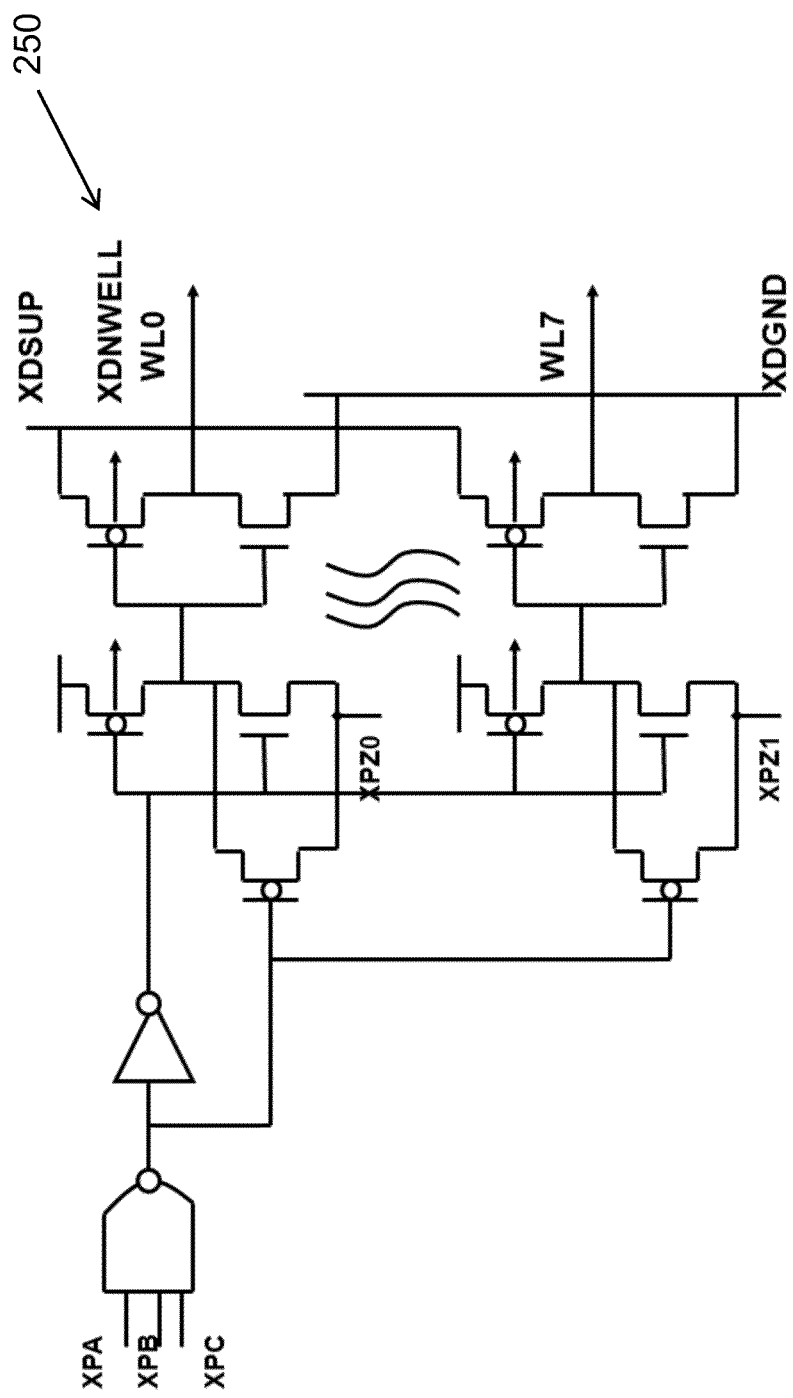
FIG. 14 is a circuit diagram of a portion of a low voltage decoder that supplies voltages for programming, erasing, and reading memory cells of the present invention.

FIG. 14 illustrates a low voltage row decoder 250 to be used in circuit 104 of FIG. 4. Decoder 250 is used provide the voltage for terminal WL0-WL7 (22) for both planes A/B in FIG. 5.

Figure 15:
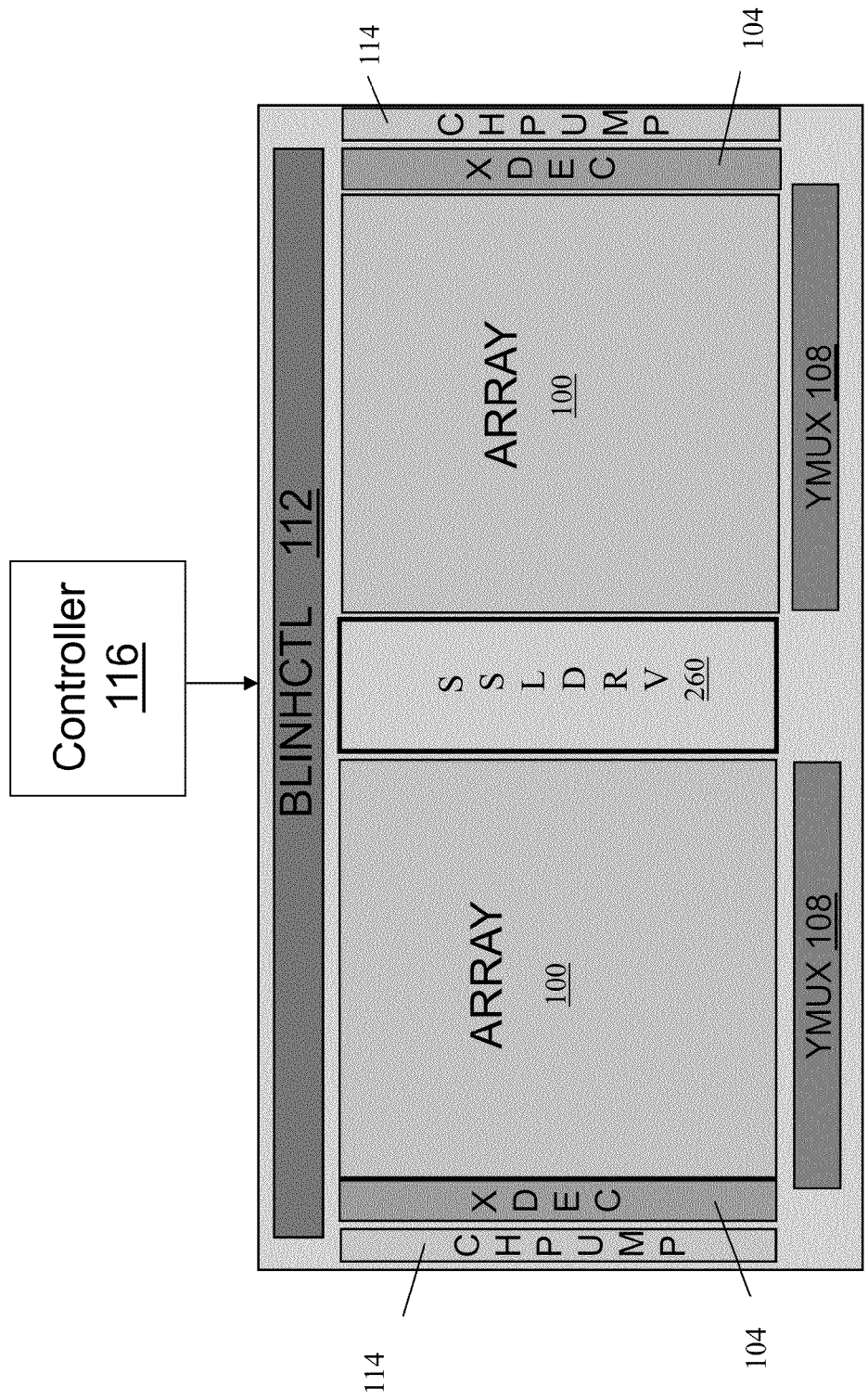
FIG. 15 is a block diagram of two memory arrays of the non-volatile memory device of the present invention.

FIG. 15 illustrates two of the memory arrays 100 disposed near each other, with a shared source line driver SSLDRV 260 between the two arrays 100. The low voltage decoder 250 of FIG. 14 is included in decoder 104. Decoders 200, 210, 220, 230 and 240 of FIGS. 9-13 are included in driver SSLDRV 260. This configuration reduces space and increases efficiency because SSLDRV 260 controls both arrays 100 in FIG. 15, instead of using separate source line drivers for each array 100.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper operation of the memory array of the present invention.

What is claimed is:

1. A non-volatile memory device, comprising:
    N planes of non-volatile memory cells, where N is an integer greater than 1, wherein each plane of non-volatile memory cells includes a plurality of memory cells configured in rows and columns, and wherein each of the N planes includes first gate lines that extend across the rows of the memory cells therein but do not extend to others of the N planes of non-volatile memory cells, and wherein the N planes include second gate lines that each extends across one of the rows of the memory cells in each of the N planes;
    a controller configured to:
    divide each of a plurality of words of data into N fractional-words, and
    program each of the N fractional-words of each word of data into a different one of the N planes of non-volatile memory cells.

2. The non-volatile memory device of claim 1, wherein the controller configuration to program each of the N fractional-words of each word of data into a different one of the N planes of non-volatile memory cells further comprises:
    program a first of the N fractional-words for each of the plurality of words of data into a first of the N planes of non-volatile memory cells; and then
    program a second of the N fractional-words for each of the plurality of words of data into a second of the N planes of non-volatile memory cells.

3. The non-volatile memory device of claim 1, wherein the controller configuration to program each of the N fractional-words of each word of data into a different one of the N planes of non-volatile memory cells further comprises:
    program the N fractional-words for a first of the plurality of words of data into the N planes of non-volatile memory cells; and then
    program the N fractional-words for a second of the plurality of words of data into the N planes of non-volatile memory cells.

4. The non-volatile memory device of claim 1, further comprising:
    a charge pump configured to selectively supply voltages to one or more of the gate lines in just one of the N planes of non-volatile memory cells at any given time.

5. The non-volatile memory device of claim 1, further comprising:
    a charge pump for selectively supplying voltages to the gate lines, wherein the controller is configured to control the charge pump to selectively supply the voltages to one or more of the gate lines in just one of the N planes of non-volatile memory cells at any given time.

6. The non-volatile memory device of claim 1, wherein each of the N planes of non-volatile memory cells further comprises:
    a source line decoder circuit immediately adjacent thereto.

7. A method of operating a non-volatile memory device that includes N planes of non-volatile memory cells, where N is an integer greater than 1, wherein each plane of non-volatile memory cells includes a plurality of memory cells configured in rows and columns, and wherein each of the N planes includes first gate lines that extend across the rows of the memory cells therein but do not extend to others of the N planes of non-volatile memory cells, and wherein the N planes include second gate lines that each extends across one of the rows of the memory cells in each of the N planes the method comprising:
    dividing each of a plurality of words of data into N fractional-words; and
    programming each of the N fractional-words of each word of data into a different one of the N planes of non-volatile memory cells.

8. The method of claim 7, wherein the programming further comprises:
programming a first of the N fractional-words for each of the plurality of words of data into a first of the N planes of non-volatile memory cells; and then
programming a second of the N fractional-words for each of the plurality of words of data into a second of the N planes of non-volatile memory cells.

9. The method of claim 7, wherein the programming further comprises:
programming the N fractional-words for a first of the plurality of words of data into the N planes of non-volatile memory cells; and then
programming the N fractional-words for a second of the plurality of words of data into the N planes of non-volatile memory cells.

10. The method of claim 7, wherein the programming further comprises:
selectively supplying voltages from a charge pump to one or more of the gate lines in just one of the N planes of non-volatile memory cells at any given time.

11. The method of claim 7, wherein a number of bits to be programmed for the N fractional words is less than a bit size of each of the fractional words, and wherein the programming of each of the N fractional-words is performed in a single programming operation.

12. The method of claim 7, wherein one of the plurality of words comprises first and second half-words, and wherein the first half-word has a data pattern of '1,' the method further comprising:
enabling programming of the second half-word.

13. The method of claim 7, wherein one of the fractional words has a data pattern of '1', the method further comprising:
disabling the programming of the one fractional word.

14. A non-volatile memory device, comprising:
N planes of non-volatile memory cells, where N is an integer greater than 1, wherein each plane of non-volatile memory cells includes a plurality of memory cells configured in rows and columns, and wherein each of the N planes includes gate lines that extend across the rows of the memory cells therein;
a controller configured to:
divide each of a plurality of words of data into N fractional-words,
program each of the N fractional-words of each word of data into one of the N planes of non-volatile memory cells using a programming current and within a program time period,
vary the programming current by a factor, and
inversely vary the program time period by the factor.

15. The non-volatile memory device of claim 14, wherein the factor is proportional to a number of bits of one of the words of data or one of the fractional words, and is inversely proportional to a number of bits to be programmed.

16. The non-volatile memory device of claim 14, wherein the N fractional-words are programmed independently and concurrently.

17. The non-volatile memory device of claim 14, wherein a plurality of the N fractional-words are programmed independently and concurrently.

18. A non-volatile memory device, comprising:
first and second memory arrays, wherein each of the memory arrays includes N planes of non-volatile memory cells, where N is an integer greater than 1, wherein each plane of non-volatile memory cells includes a plurality of memory cells configured in rows and columns, and wherein each of the N planes includes first gate lines that extend across the rows of the memory cells therein but do not extend to others of the N planes of non-volatile memory cells, and wherein the N planes include second gate lines that each extends across one of the rows of the memory cells in each of the N planes;
a controller configured to:
divide each of a plurality of words of data into N fractional-words, and
program each of the N fractional-words of each word of data into a different one of the N planes of non-volatile memory cells;
a first row decoder and a first column decoder for decoding addresses for the memory cells of the first memory array;
a second row decoder and a second column decoder for decoding addresses for the memory cells of the second memory array; and
a source line decoder disposed between the first and second memory arrays for decoding addresses for the memory cells of both the first and second memory arrays.

19. The non-volatile memory device of claim 18, wherein:
the first row decoder and the first column decoder are immediately adjacent to the first memory array; and
the second row decoder and the second column decoder are immediately adjacent to the second memory array.

20. The non-volatile memory device of claim 19, wherein the source line decoder is immediately adjacent to the first memory array and immediately adjacent to the second memory array.

* * * * *